United States Patent
Chuang

(10) Patent No.: US 11,942,331 B2
(45) Date of Patent: Mar. 26, 2024

(54) METHOD FOR PREPARING SEMICONDUCTOR DEVICE STRUCTURE WITH ISOLATION PATTERNS HAVING DIFFERENT HEIGHTS

(71) Applicant: NANYA TECHNOLOGY CORPORATION, New Taipei (TW)

(72) Inventor: Ching-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 324 days.

(21) Appl. No.: 17/550,321

(22) Filed: Dec. 14, 2021

(65) Prior Publication Data

US 2023/0187218 A1    Jun. 15, 2023

(51) Int. Cl.
*H01L 21/311* (2006.01)

(52) U.S. Cl.
CPC .. *H01L 21/31144* (2013.01); *H01L 21/31116* (2013.01)

(58) Field of Classification Search
None
See application file for complete search history.

(56) References Cited

U.S. PATENT DOCUMENTS

| 6,004,862 | A | 12/1999 | Kim et al. | |
| 10,937,688 | B2 | 3/2021 | Liu et al. | |
| 2019/0067086 | A1* | 2/2019 | Liu | H01L 23/5384 |
| 2020/0251338 | A1* | 8/2020 | Mignot | H01L 21/3088 |

OTHER PUBLICATIONS

Office Action dated Jan. 13, 2023 related to Taiwanese Application No. 111109349.

* cited by examiner

*Primary Examiner* — Stephanie P Duclair
(74) *Attorney, Agent, or Firm* — Xuan Zhang

(57) ABSTRACT

A method for preparing a semiconductor device structure is provided. The method includes forming a target layer over a semiconductor substrate; forming an energy-sensitive layer over the target layer; performing a first energy treating process to form a plurality of first treated portions in the energy-sensitive layer; performing a second energy treating process to form a plurality of second treated portions in the energy-sensitive layer; removing the first treated portions and the second treated portions to respectively form a plurality of first openings and a plurality of second openings; transferring the first openings and the second openings into the target layer to respectively form a plurality of third openings and a plurality of fourth openings; and transferring the third openings and the fourth openings into the semiconductor substrate to respectively form a plurality of fifth openings and a plurality of sixth openings.

14 Claims, 22 Drawing Sheets

METHOD FOR PREPARING SEMICONDUCTOR DEVICE STRUCTURE WITH ISOLATION PATTERNS HAVING DIFFERENT HEIGHTS

TECHNICAL FIELD

The present disclosure relates to a method for preparing a semiconductor device structure, and more particularly, to a method for preparing a semiconductor device structure with isolation patterns having different heights.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device structure is provided. The method includes forming a target layer over a semiconductor substrate, and forming an energy-sensitive layer over the target layer. The method also includes performing a first energy treating process to form a first treated portion in the energy-sensitive layer, and performing a second energy treating process to form a second treated portion in the energy-sensitive layer. The method further includes removing the first treated portion and the second treated portion to form a first opening and a second opening in the energy-sensitive layer, and transferring the first opening and the second opening into the target layer.

In an embodiment, the first energy treating process and the second energy treating process are electron-beam (e-beam) writing processes. In an embodiment, the first treated portion is formed by applying a first energy to the energy-sensitive layer, and the second treated portion is formed by applying a second energy to the energy-sensitive layer, wherein the first energy is different from the second energy. In an embodiment, the first treated portion and the second treated portion have different heights. In an embodiment, the method further includes removing the energy-sensitive layer after the first opening and the second opening are transferred into the target layer. In an embodiment, the energy-sensitive layer includes a cross-linking compound having a cross-linking functional group. In an embodiment, the cross-linking functional group includes a double bond.

In an embodiment, the first treated portion penetrates through the energy-sensitive layer. In an embodiment, a bottom surface of the second treated portion is higher than a bottom surface of the energy-sensitive layer. In an embodiment, the target layer is exposed by the first opening. In an embodiment, a bottom surface of the second opening is higher than a top surface of the target layer. In an embodiment, the first opening and the second opening are transferred into the target layer to form a third opening and a fourth opening by a dry etching process. In an embodiment, the semiconductor substrate is exposed by the third opening. In an embodiment, a bottom surface of the fourth opening is higher than a top surface of the semiconductor substrate.

In another embodiment of the present disclosure, a method for preparing a semiconductor device structure is provided. The method includes forming a target layer over a semiconductor substrate, and forming an energy-sensitive layer over the target layer. The method also includes performing a first energy treating process to form a plurality of first treated portions in the energy-sensitive layer, and performing a second energy treating process to form a plurality of second treated portions in the energy-sensitive layer. The method further includes removing the first treated portions and the second treated portions to respectively form a plurality of first openings and a plurality of second openings, and transferring the first openings and the second openings into the target layer to respectively form a plurality of third openings and a plurality of fourth openings. In addition, the method includes transferring the third openings and the fourth openings into the semiconductor substrate to respectively form a plurality of fifth openings and a plurality of sixth openings, and filling the fifth openings and the sixth openings with an isolation structure.

In an embodiment, the isolation structure has different heights in different cross-sections. In an embodiment, the first energy treating process and the second energy treating process are electron-beam (e-beam) writing processes. In an embodiment, the first treated portions are formed by applying a first energy to the energy-sensitive layer, and the second treated portions are formed by applying a second energy to the energy-sensitive layer, wherein the second energy is greater than the first energy. In an embodiment, the first treated portions have a first height, and the second treated portions have a second height, wherein the second height is greater than the first height. In an embodiment, the first treated portions extend along a first direction, and the second treated portions extend along a second direction different from the first direction. In an embodiment, the first treated portions are parallel to each other, and each of the second treated portions is located between and in direct contact with any two adjacent ones of the first treated portions.

In an embodiment, the method further includes removing the energy-sensitive layer after the third openings and the fourth openings are formed in the target layer. In an embodiment, the method further includes removing the target layer after the fifth openings and the sixth openings are formed in the semiconductor substrate. In an embodiment, the target layer is removed before the isolation structure is formed. In an embodiment, the energy-sensitive layer includes a cross-linking compound having a cross-linking functional group.

In an embodiment, the cross-linking functional group includes a double bond. In an embodiment, bottom surfaces of the first treated portions are higher than bottom surfaces of the second treated portions. In an embodiment, bottom surfaces of the first openings in the energy-sensitive layer are higher than bottom surfaces of the second openings in the energy-sensitive layer. In an embodiment, bottom surfaces of the third openings in the target layer are higher than bottom surfaces of the fourth openings in the target layer. In an embodiment, bottom surfaces of the fifth openings in the semiconductor substrate are higher than bottom surfaces of the sixth openings in the semiconductor substrate.

Embodiments of a method for preparing a semiconductor device structure are provided in the disclosure. The method includes sequentially forming a target layer and an energy-sensitive layer over a semiconductor substrate, and forming a first treated portion and a second treated portion in the energy-sensitive layer. The method also includes removing the first treated portion and the second treated portion to form a first opening and a second opening, and transferring the first and the second openings into the target layer. In some embodiments, the first treated portion and the second treated portion have different heights. Therefore, the openings with different heights (i.e., depths) can be formed in the target layer using the same pattern transferring process. As a result, the fabrication cost and time of the semiconductor device structure can be reduced, and greater design flexibility can be achieved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 11 is a cross-sectional view illustrating an intermediate stage of forming first treated portions in the energy-sensitive layer, wherein FIG. 11 is taken along line A-A' in FIG. 10.

FIG. 13 is a cross-sectional view illustrating an intermediate stage of forming second treated portions in the energy-sensitive layer, wherein FIG. 13 is taken along line B-B' in FIG. 12.

FIG. 14 is a cross-sectional view illustrating an intermediate stage of removing the first treated portions to form first openings in the energy-sensitive layer, wherein FIG. 14 is taken along the same line A-A' as FIG. 10.

FIG. 15 is a cross-sectional view illustrating an intermediate stage of removing the second treated portions to form second openings in the energy-sensitive layer, wherein FIG. 15 is taken along the same line B-B' as FIG. 12.

FIG. 16 is a cross-sectional view illustrating an intermediate stage of transferring the first openings into the target layer to form third openings in the target layer, wherein FIG. 16 is taken along the same line A-A' as FIG. 10.

FIG. 17 is a cross-sectional view illustrating an intermediate stage of transferring the second openings into the target layer to form fourth openings in the target layer, wherein FIG. 17 is taken along the same line B-B' as FIG. 12.

FIG. 18 is a cross-sectional view illustrating an intermediate stage of transferring the third openings into the semiconductor substrate to form fifth openings in the semiconductor substrate, wherein FIG. 18 is taken along the same line A-A' as FIG. 10.

FIG. 19 is a cross-sectional view illustrating an intermediate stage of transferring the fourth openings into the target layer to form sixth openings in the semiconductor substrate, wherein FIG. 19 is taken along the same line B-B' as FIG. 12.

FIG. 21 is a cross-sectional view illustrating an intermediate stage of filling the fifth openings and the sixth openings with the isolation structure, wherein FIG. 21 is taken along line A-A' in FIG. 20.

FIG. 22 is a cross-sectional view illustrating an intermediate stage of filling the fifth openings and the sixth openings with the isolation structure, wherein FIG. 22 is taken along line B-B' in FIG. 20.

DETAILED DESCRIPTION

Figure 1:
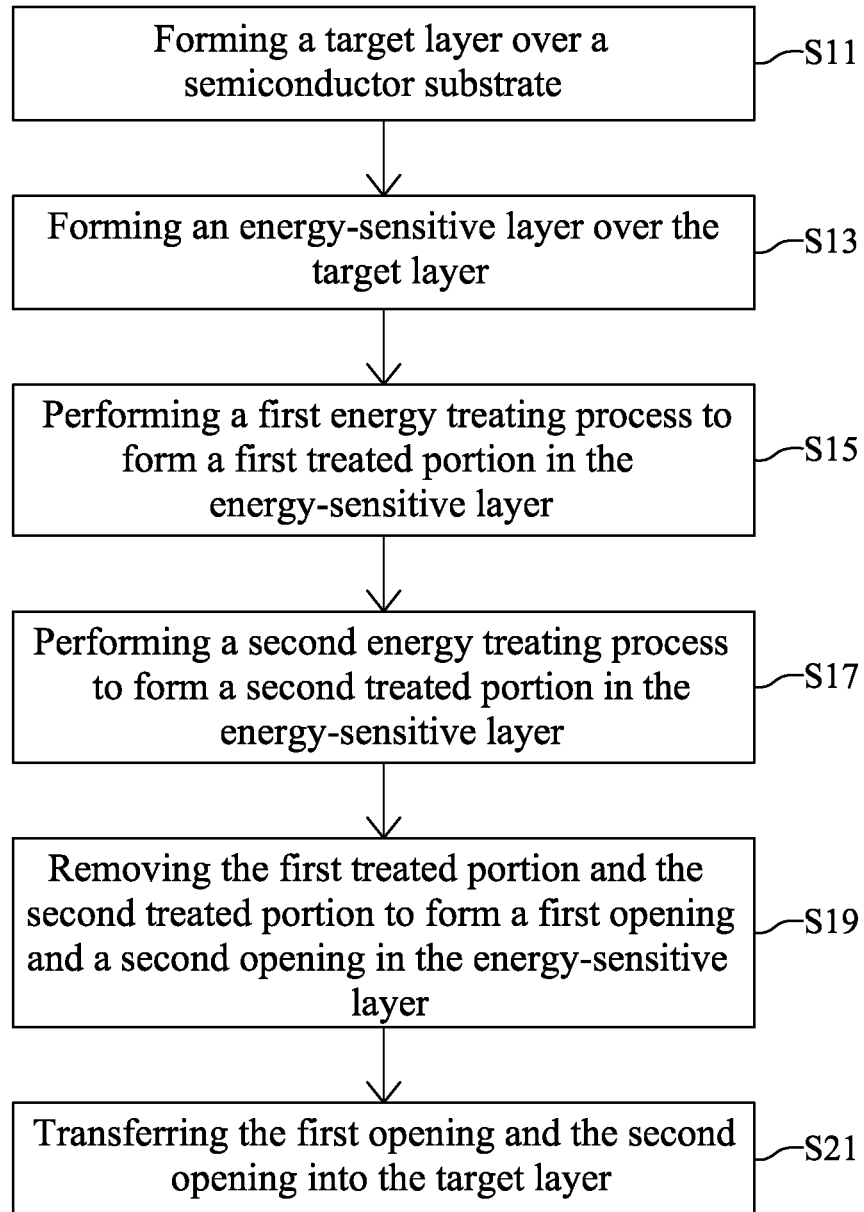
FIG. 1 is a flow diagram illustrating a method for preparing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device structure 100, and the method 10 includes steps S11, S13, S15, S17, S19 and S21, in accordance with some embodiments. The steps S11-S21 of FIG. 1 are first introduced briefly and then elaborated in connection with FIGS. 3-9. As shown in FIG. 1, the method 10 begins at step S11 where a target layer is formed over a semiconductor substrate.

Next, at step S13, an energy-sensitive layer is formed over the target layer. In some embodiments, the energy-sensitive layer includes a cross-linking compound having a cross-linking functional group. In some embodiments, the cross-linking functional group includes a double bond. At step S15, a first energy treating process is performed to form a first treated portion in the energy-sensitive layer, and at step S17, a second energy treating process is performed to form a second treated portion in the energy-sensitive layer.

In some embodiments, the first energy treating process and the second energy treating process are electron-beam (e-beam) writing processes. In some embodiments, the first treated portion is formed by applying a first energy to the energy-sensitive layer, the second treated portion is formed by applying a second energy to the energy-sensitive layer, and the first energy is different from the second energy. In some embodiments, the first treated portion and the second treated portion have different heights due to different energy levels applied in the first and the second energy treating processes.

Subsequently, at step S19, the first treated portion and the second treated portion are removed to form a first opening and a second opening in the energy-sensitive layer. At step S21, the first opening and the second opening are transferred into the target layer. In some embodiments, the first opening and the second opening are transferred by a dry etching process. In some embodiments, the first opening and the second opening with different heights (i.e., depths) are transferred to the target layer using the same pattern transferring process.

Figure 2:
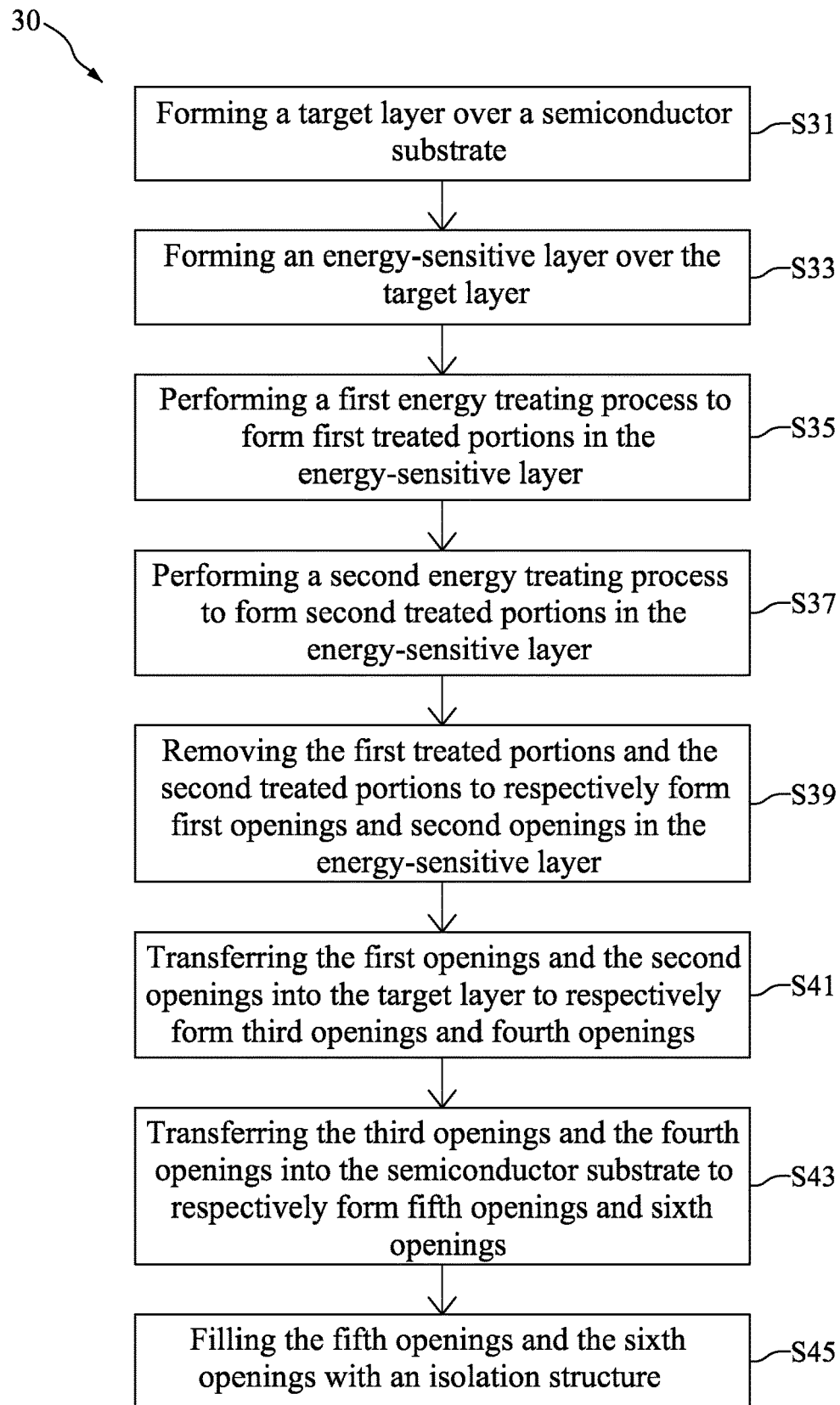
FIG. 2 is a flow diagram illustrating a method for preparing a semiconductor device structure, in accordance with some embodiments.

FIG. 2 is a flow diagram illustrating a method 30 for preparing a semiconductor device structure 200, and the method 30 includes steps S31, S33, S35, S37, S39, S41, S43 and S45, in accordance with some embodiments. The steps S31-S45 of FIG. 2 are first introduced briefly and then elaborated in connection with FIGS. 10-22. As shown in FIG. 2, the method 30 begins at step S31 where a target layer is formed over a semiconductor substrate.

Next, at step S33, an energy-sensitive layer is formed over the target layer. In some embodiments, the energy-sensitive layer includes a cross-linking compound having a cross-linking functional group. In some embodiments, the cross-linking functional group includes a double bond. At step S35, a first energy treating process is performed to form first treated portions in the energy-sensitive layer, and at step S37, a second energy treating process is performed to form second treated portions in the energy-sensitive layer.

In some embodiments, the first energy treating process and the second energy treating process are electron-beam (e-beam) writing processes. In some embodiments, the first treated portions are formed by applying a first energy to the energy-sensitive layer, the second treated portions are formed by applying a second energy to the energy-sensitive layer, and the first energy is different from the second energy. In some embodiments, the first treated portions have a first height, the second treated portions have a second height, and the first height and the second height are different due to different energy levels applied in the first and the second energy treating processes.

Subsequently, at step S39, the first treated portions and the second treated portions are removed to form first openings and second openings in the energy-sensitive layer. At step S41, the first openings and the second openings are transferred into the target layer to form third openings and fourth openings. In some embodiments, the first openings and the second openings are transferred by a dry etching process. In some embodiments, the first openings and the second openings with different heights (i.e., depths) are transferred to the target layer using the same pattern transferring process.

Next, at step S43, the third openings and the fourth openings are transferred into the semiconductor substrate to form fifth openings and sixth openings. In some embodiments, the third openings and the fourth openings are transferred by a dry etching process. In some embodiments, the third openings and the fifth openings with different heights (i.e., depths) are transferred to the semiconductor substrate using the same pattern transferring process. At step S45, the fifth openings and the sixth openings in the semiconductor substrate are filled with an isolation structure. In some embodiments, the isolation structure has different heights in different cross-sections.

Figure 3:
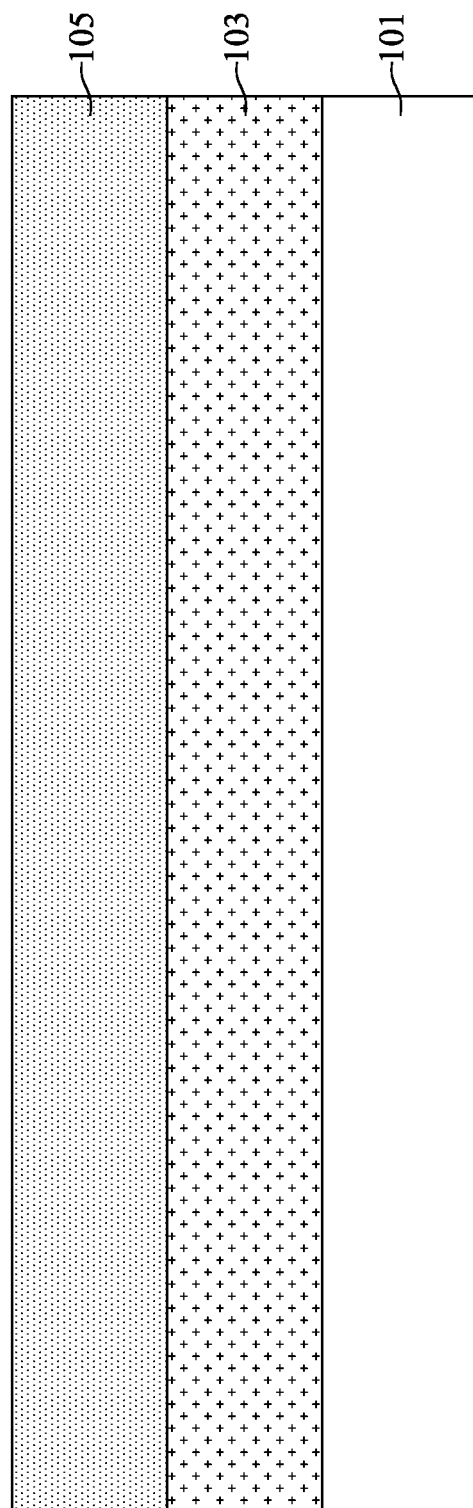
FIG. 3 is a cross-sectional view illustrating an intermediate stage of sequentially forming a target layer and an energy-sensitive layer over a semiconductor substrate during the formation of the semiconductor device structure, in accordance with some embodiments.

FIGS. 3-9 are cross-sectional views illustrating various stages of forming the semiconductor device structure 100 (FIG. 9) by the method 10 of FIG. 1, in accordance with some embodiments. As shown in FIG. 3, a target layer 103 is formed over a semiconductor substrate 101, and an energy-sensitive layer 105 is formed over the target layer 103, in accordance with some embodiments. The respective steps are illustrated as the steps S11-S13 in the method 10 shown in FIG. 1.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the target layer 103 includes a dielectric material, such as silicon oxide, silicon nitride, silicon oxynitride, a low-k dielectric material or another suitable material. However, any suitable materials may be utilized. In some embodiments, the target layer 103 is formed by a deposition process, such as a chemical vapor deposition (CVD) process, a physical vapor deposition (PVD) process, an atomic layer deposition (ALD) process, a spin-on coating process, or another suitable method.

Moreover, in some embodiments, the energy-sensitive layer 105 includes a cross-linking compound having a cross-linking functional group. In some embodiments, the cross-linking functional group includes a double bond. In some embodiments, the cross-linking compound has a hydrogen-bonding group, a polymerizable diacetylene group, or a combination thereof. Similar to the method for forming the target layer 103, the energy-sensitive layer 105 may be formed by a deposition process, such as a CVD process, a PVD process, an ALD process, a spin-on coating process, or another suitable method.

Figure 4:
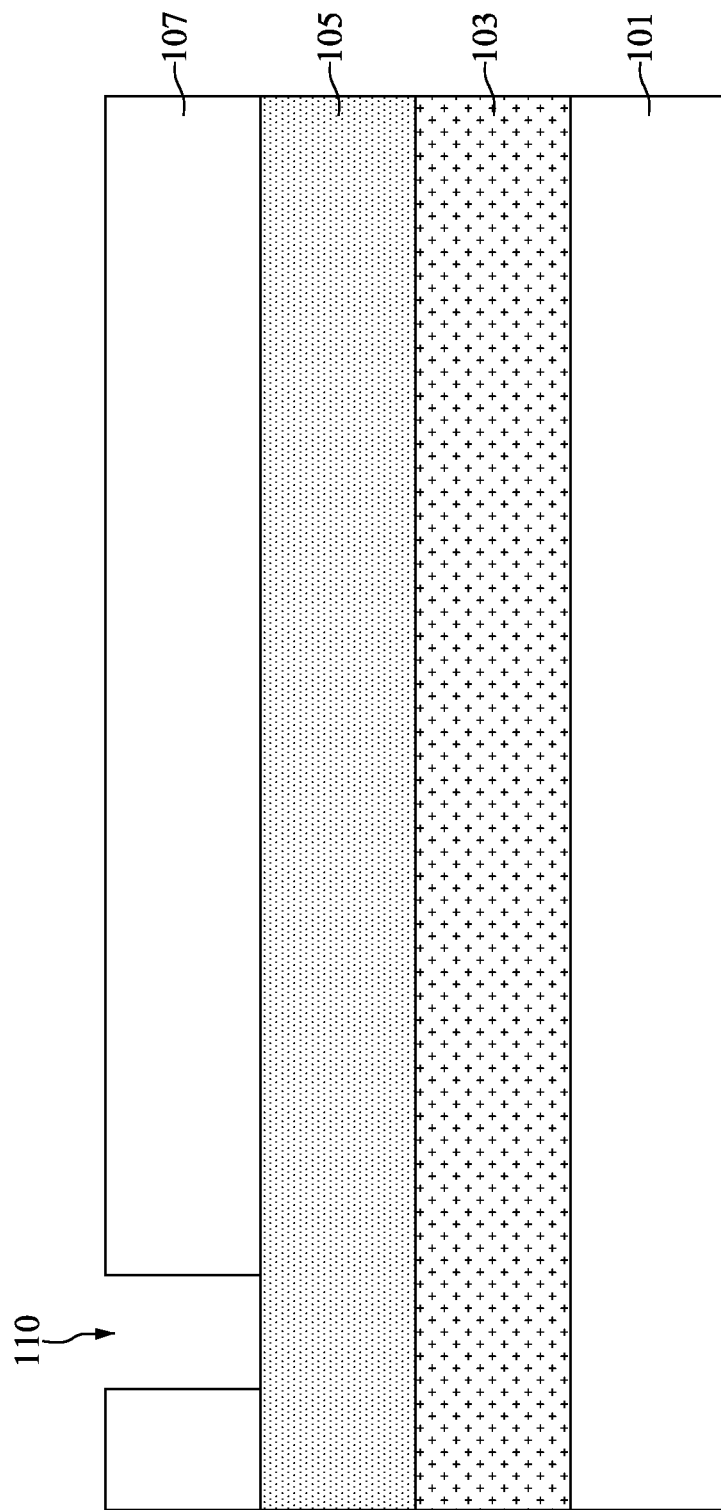
FIG. 4 is a cross-sectional view illustrating an optional intermediate stage of forming a patterned hard mask over the energy-sensitive layer during the formation of the semiconductor device structure, in accordance with some embodiments.

Next, a patterned hard mask 107 is formed over the energy-sensitive layer 105, as shown in FIG. 4 in accordance with some embodiments. The patterned hard mask 107 may be formed by a procedure including deposition and patterning. In some embodiments, the patterned hard mask 107 includes an opening 110 exposing a portion of the energy-sensitive layer 105, and the patterned hard mask 107 functions as a mask for a subsequent energy treating process.

In some embodiments, the patterned hard mask 107 is optionally formed depending on the energy source of the subsequent energy treating process. For example, if the energy source of the subsequent energy treating process is visible light, ultraviolet (UV), deep ultraviolet (DUV), extreme ultraviolet (EUV), or X-ray, the patterned hard mask 107 is formed to serve as a mask in the energy treating process. If the energy source of the subsequent energy treating process is an electron-beam (e-beam) or an ion beam, the formation of the patterned hard mask 107 can be omitted.

Moreover, in some embodiments, the patterned hard mask 107 includes silicon oxide, silicon nitride, silicon oxynitride, silicon oxycarbide, silicon carbon nitride, metal oxide, or another suitable material. In some embodiments, the patterned hard mask 107 is selected to have a lower etch rate than the energy-sensitive layer 105.

Figure 5:
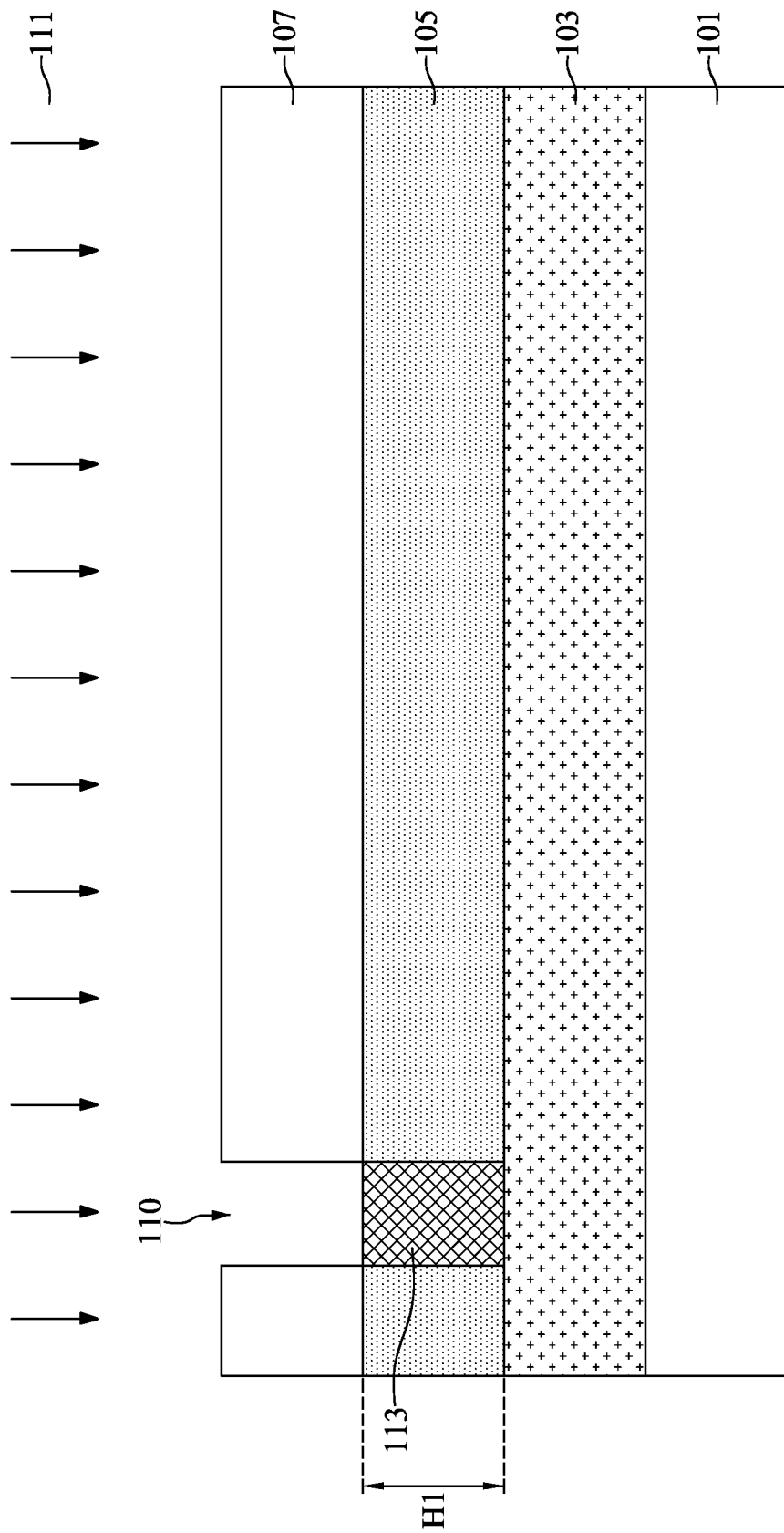
FIG. 5 is a cross-sectional view illustrating an intermediate stage of performing a first energy treating process to form a first treated portion in the energy-sensitive layer, in accordance with some embodiments.

Subsequently, a first energy treating process 111 is performed to form a first treated portion 113 in the energy-sensitive layer 103, as shown in FIG. 5 in accordance with some embodiments. In some embodiments, a portion of the energy-sensitive layer 105 exposed by the opening 110 is transformed into the first treated portion 113. The respective step is illustrated as the step S15 in the method 10 shown in FIG. 1. As mentioned above, the energy source of the first energy treating process 111 includes visible light, UV, DUV, EUV, X-ray, e-beam, ion beam, or another suitable energy source, in accordance with some embodiments.

In some embodiments, the energy used in the first energy treating process 111 is selected such that the first treated portion 113 penetrates through the energy-sensitive layer 105. In other words, the height of the first treated portion 113 is the same as the height of the energy-sensitive layer 105 (e.g., the height H1). However, other energy level may be utilized during the first energy treating process 111 such that the resulting bottom surface of the first treated portion 113 is higher than the bottom surface of the energy-sensitive layer 105. After the first treated portion 113 is formed, the patterned hard mask 107 may be removed. For example, the patterned hard mask 107 may be removed by a wet etching process or an ashing process.

Figure 6:
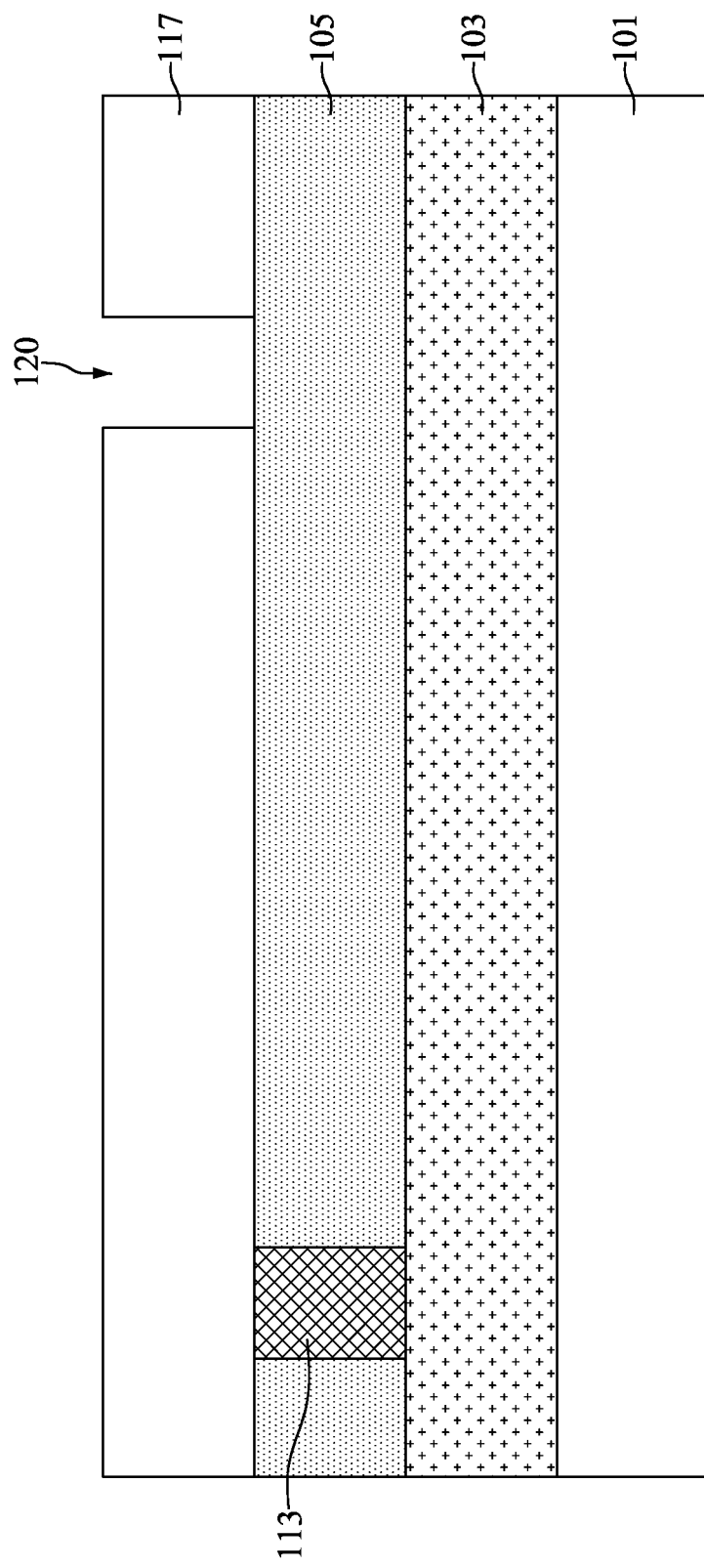
FIG. 6 is a cross-sectional view illustrating an optional intermediate stage of forming another patterned hard mask over the energy-sensitive layer during the formation of the semiconductor device structure, in accordance with some embodiments.

Next, another patterned hard mask 117 is formed over the energy-sensitive layer 105, as shown in FIG. 6 in accordance with some embodiments. Similar to the patterned hard mask 107 shown in FIG. 4, the patterned hard mask 117 may be formed by a procedure including deposition and patterning. In some embodiments, the patterned hard mask 117 includes an opening 120 exposing a portion of the energy-sensitive layer 105, and the patterned hard mask 117 functions as a mask for a subsequent energy treating process.

In some embodiments, the patterned hard mask 117 is optionally formed depending on the energy source of the subsequent energy treating process. For example, if the energy source of the subsequent energy treating process is visible light, UV, DUV, EUV, or X-ray, the patterned hard mask 117 is formed to serve as a mask in the energy treating process. If the energy source of the subsequent energy treating process is an e-beam or an ion beam, the formation of the patterned hard mask 117 can be omitted. Some materials used to form the patterned hard mask 117 are similar to, or the same as those used to form the patterned hard mask 107, and details thereof are not repeated herein. In some embodiments, the patterned hard mask 117 is selected to have a lower etch rate than the energy-sensitive layer 105.

Figure 7:
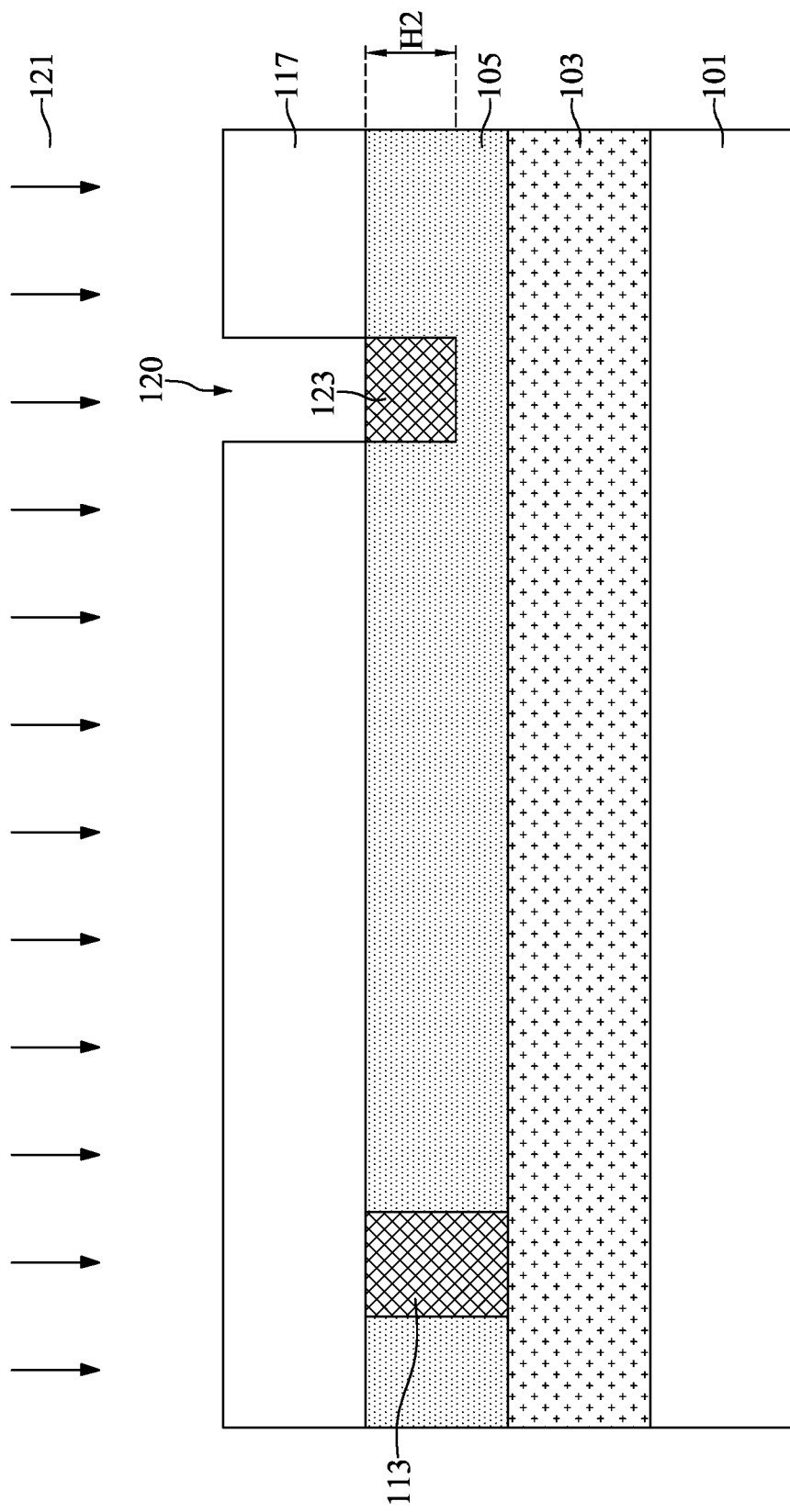
FIG. 7 is a cross-sectional view illustrating an intermediate stage of performing a second energy treating process to form a second treated portion in the energy-sensitive layer, in accordance with some embodiments.

Subsequently, a second energy treating process 121 is performed to form a second treated portion 123 in the energy-sensitive layer 105, as shown in FIG. 7 in accordance with some embodiments. In some embodiments, a portion of the energy-sensitive layer 105 exposed by the opening 120 is transformed into the second treated portion 123. The respective step is illustrated as the step S17 in the method 10 shown in FIG. 1. As mentioned above, the energy source of the second energy treating process 121 includes visible light, UV, DUV, EUV, X-ray, e-beam, ion beam, or another suitable energy source, in accordance with some embodiments.

In some embodiments, the energy (i.e., energy level) used in the first energy treating process 111 is greater than the energy (i.e., energy level) used in the second energy treating process 121, such that the height H1 of the first treated portion 113 (see FIG. 5) is greater than a height H2 of the second treated portion 123. In some embodiments, the bottom surface of the second treated portion 123 is higher than the bottom surface of the energy-sensitive layer 105 (i.e., the top surface of the target layer 103). In some embodiments, the bottom surface of the second treated portion 123 is higher than the bottom surface of the first treated portion 113. After the second treated portion 123 is formed, the patterned hard mask 117 may be removed.

Figure 8:
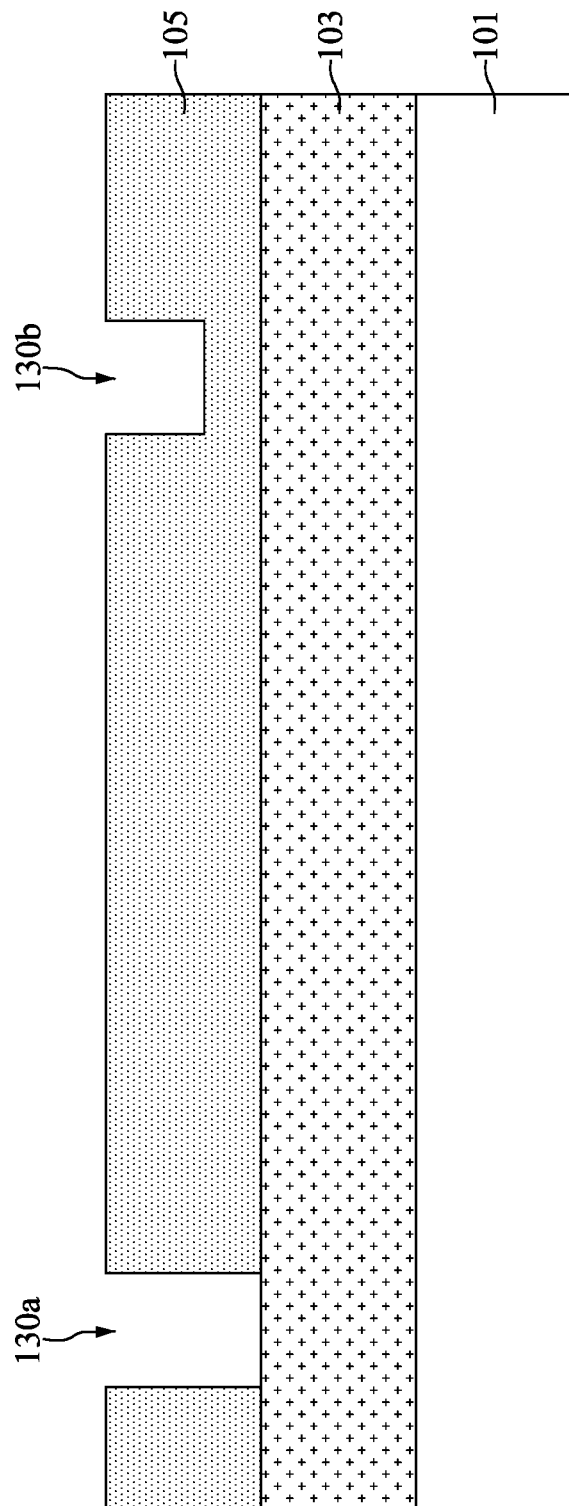
FIG. 8 is a cross-sectional view illustrating an intermediate stage of removing the first treated portion and the second treated portion to form a first opening and a second opening, in accordance with some embodiments.

Then, the first treated portion 113 and the second treated portion 123 are removed to form openings 130a and 130b in the energy-sensitive layer 105, as shown in FIG. 8 in accordance with some embodiments. The respective step is illustrated as the step S19 in the method 10 shown in FIG. 1. In some embodiments, the bottom surface of the opening 130b is higher than the bottom surface of the opening 130a. In some embodiments, the first treated portion 113 and the second treated portion 123 are removed by an etching process. The etching process may include a wet etching process, a dry etching process, or a combination thereof.

Figure 9:
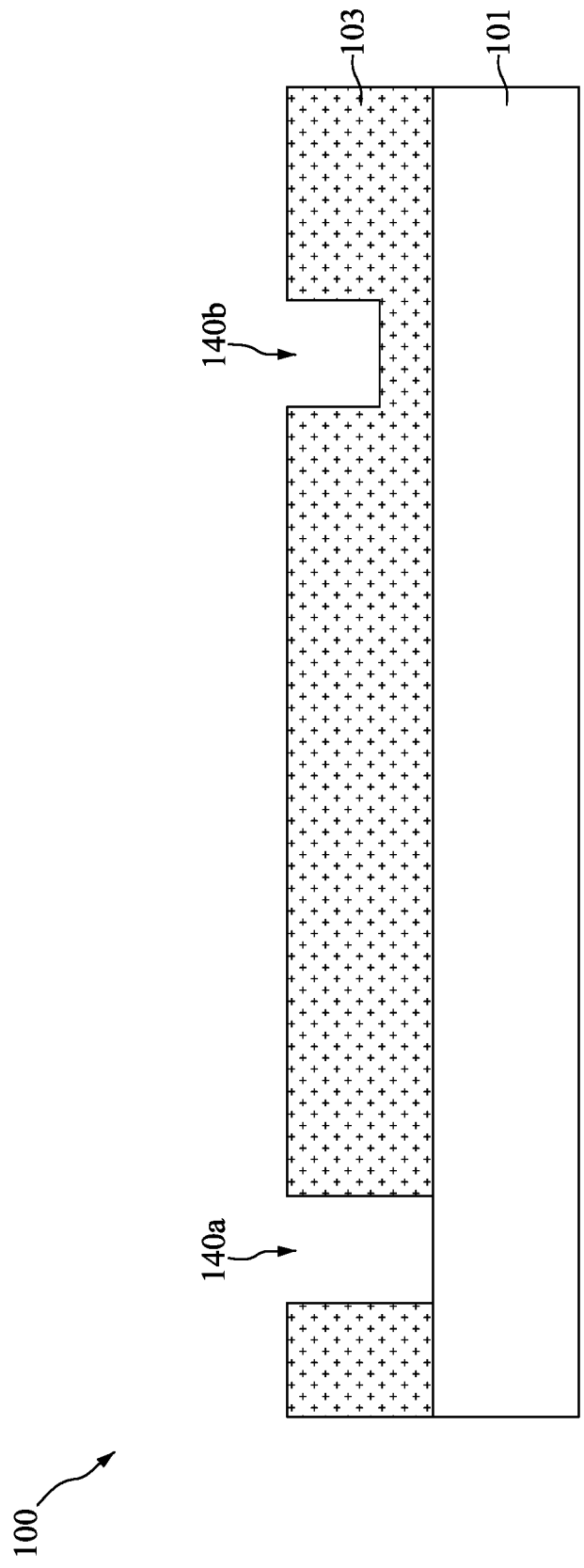
FIG. 9 is a cross-sectional view illustrating an intermediate stage of transferring the first opening and the second opening into the target layer, in accordance with some embodiments.

Next, the openings 130a and 130b in the energy-sensitive layer 105 are transferred into the target layer 103, such that openings 140a and 140b are formed in the target layer 103, as shown in FIG. 9 in accordance with some embodiments. The respective step is illustrated as the step S21 in the method 10 shown in FIG. 1. In some embodiments, the openings 130a and 130b are transferred into the target layer 103 by an etching process, such as a dry etching process. In some embodiments, the bottom surface of the opening 140b is higher than the bottom surface of the opening 140a. After the openings 140a and 140b are formed, the energy-sensitive layer 105 may be removed, and the semiconductor device structure 100 is obtained.

Figure 10:
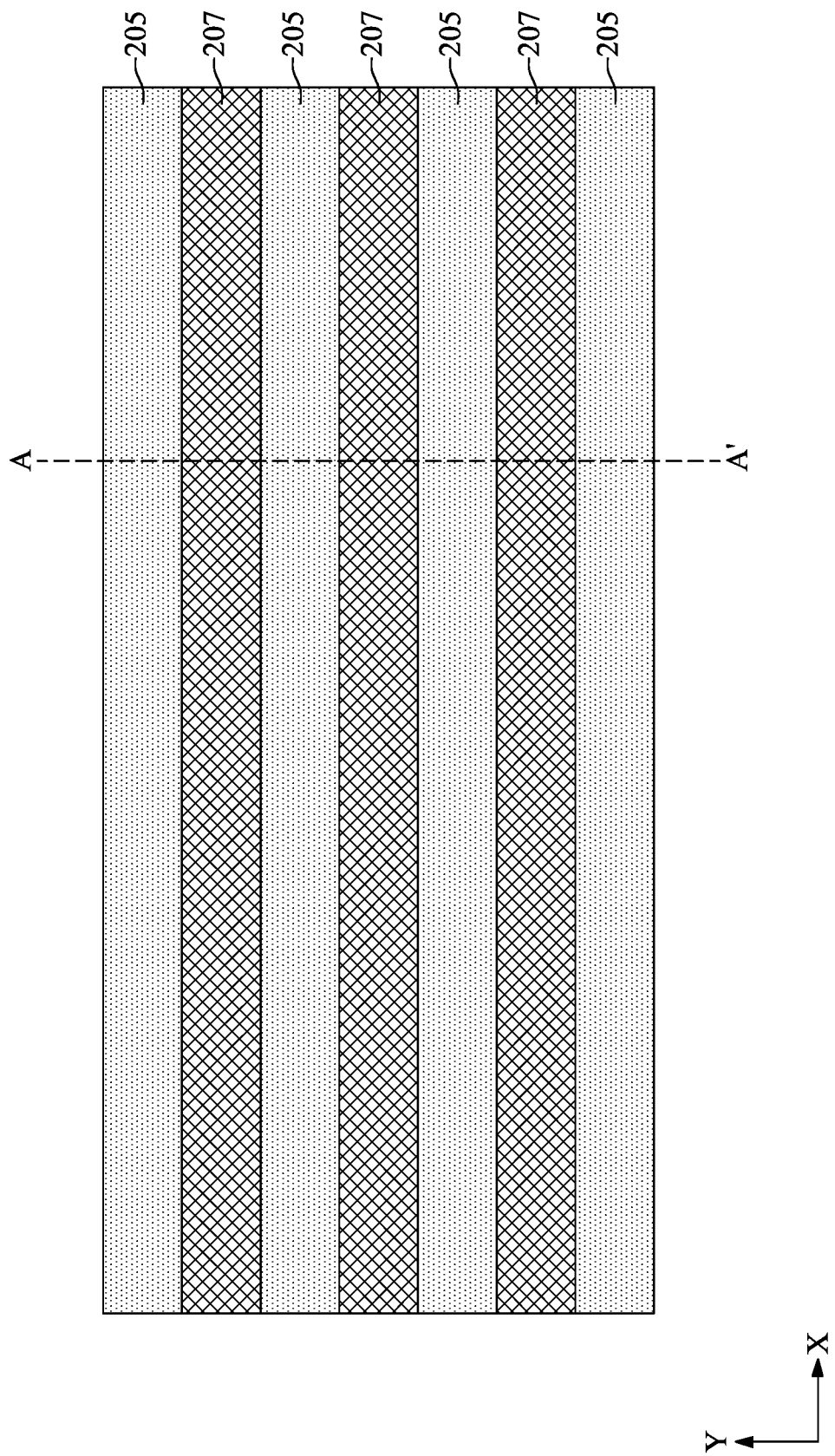
FIG. 10 is a top view illustrating an intermediate stage of forming first treated portions in an energy-sensitive layer over a target layer and a semiconductor substrate, in accordance with some embodiments.
Figure 18:
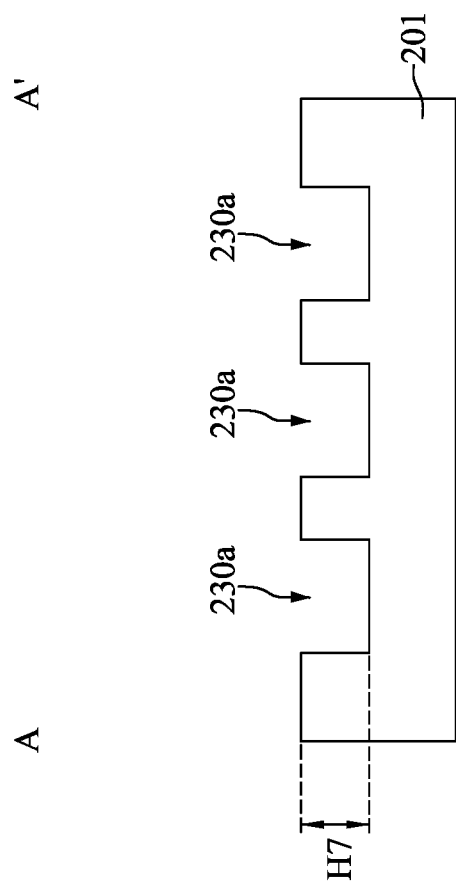
Figure 19:
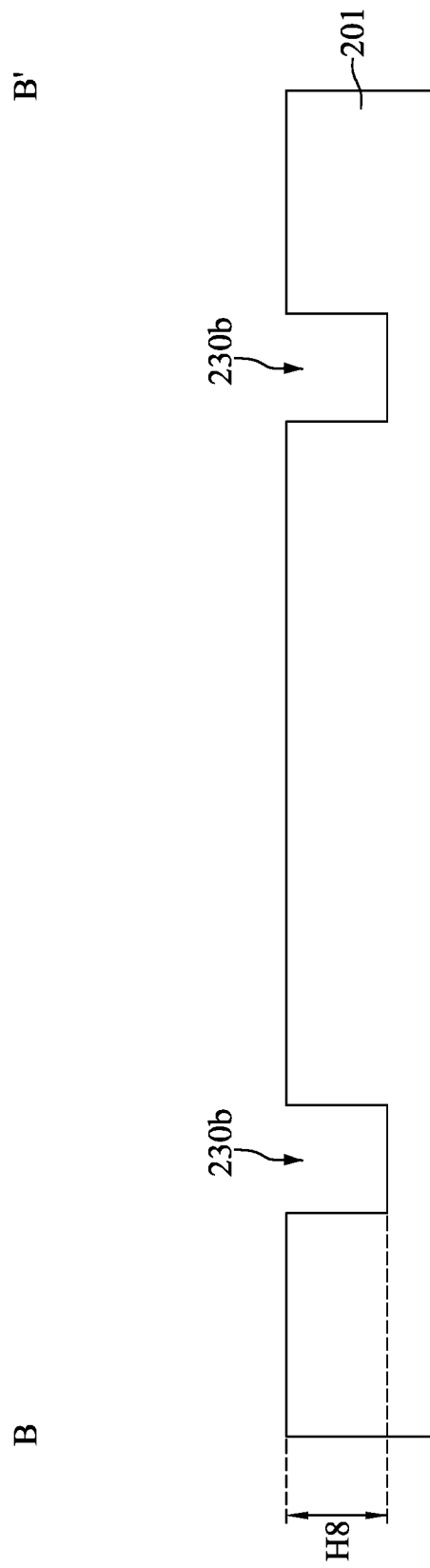
Figure 20:
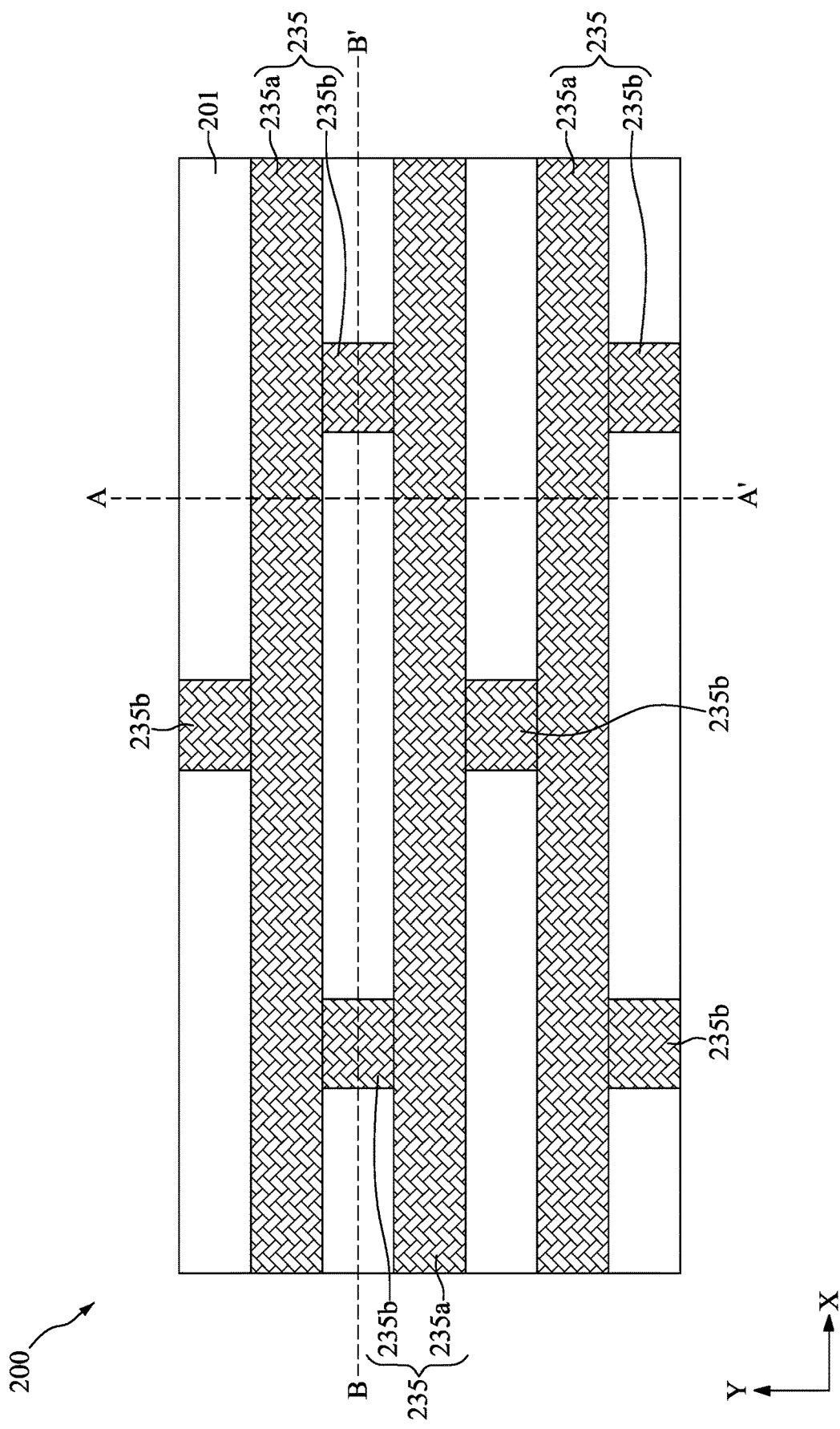
FIG. 20 is a top view illustrating an intermediate stage of filling the fifth openings and the sixth openings with an isolation structure, in accordance with some embodiments.

FIGS. 11, 13-19, and 21-22 are cross-sectional views illustrating various stages of forming the semiconductor device structure 200 (FIGS. 20-22) by the method 30 of FIG. 2, in accordance with some embodiments. FIGS. 10 and 12 are top views illustrating the structures of FIGS. 11 and 13, respectively, and FIG. 20 is a top view illustrating the structure of FIGS. 21 and 22.

Figure 11:
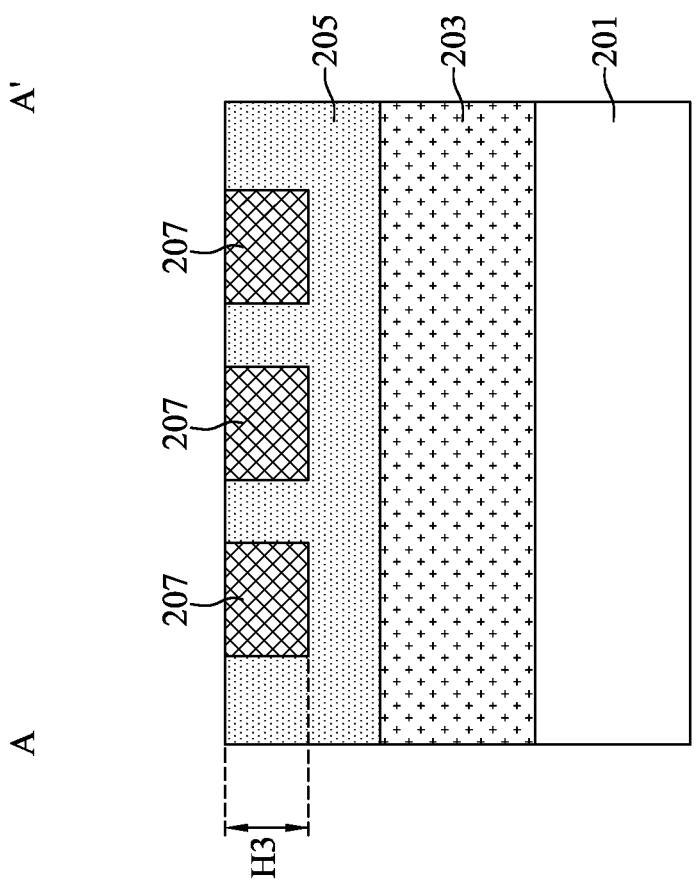
Figure 12:
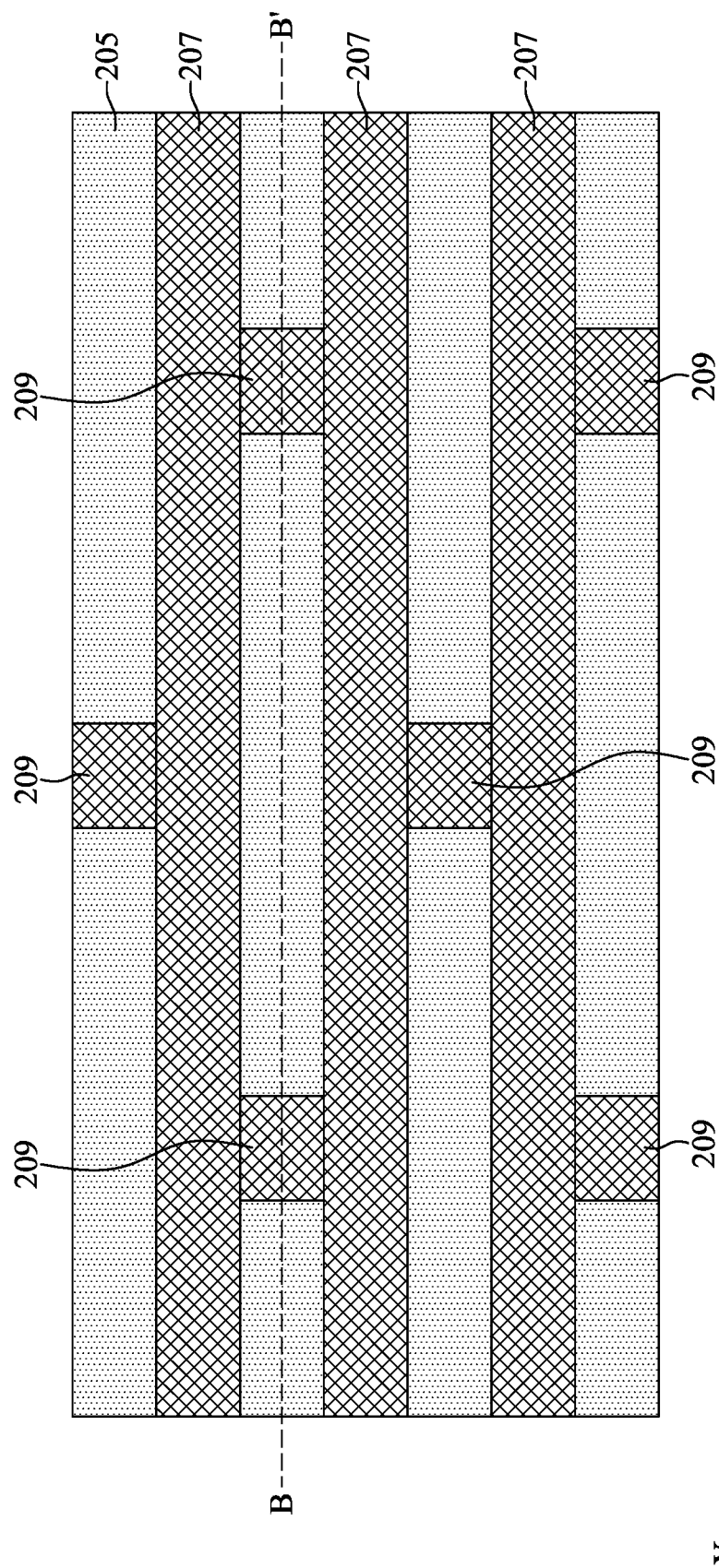
FIG. 12 is a top view illustrating an intermediate stage of forming second treated portions in the energy-sensitive layer, in accordance with some embodiments.
Figure 13:
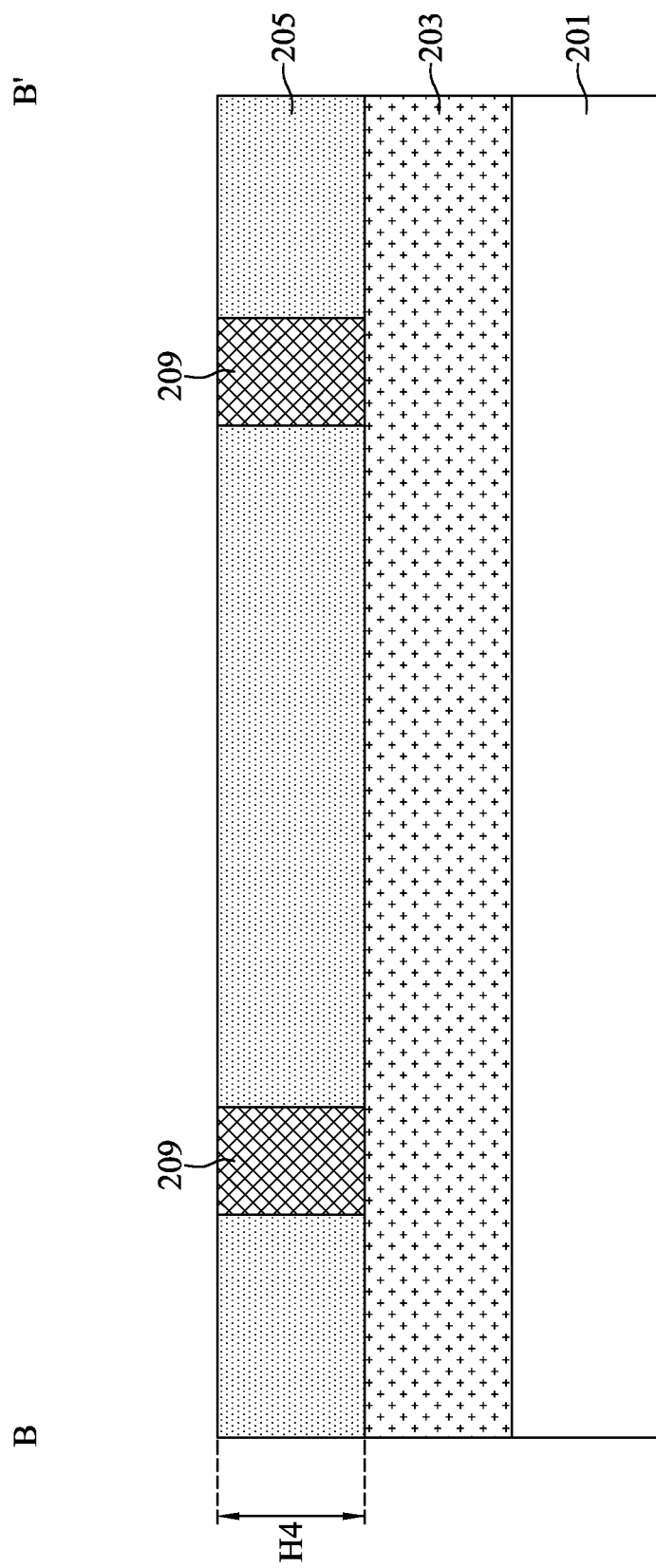
Figure 14:
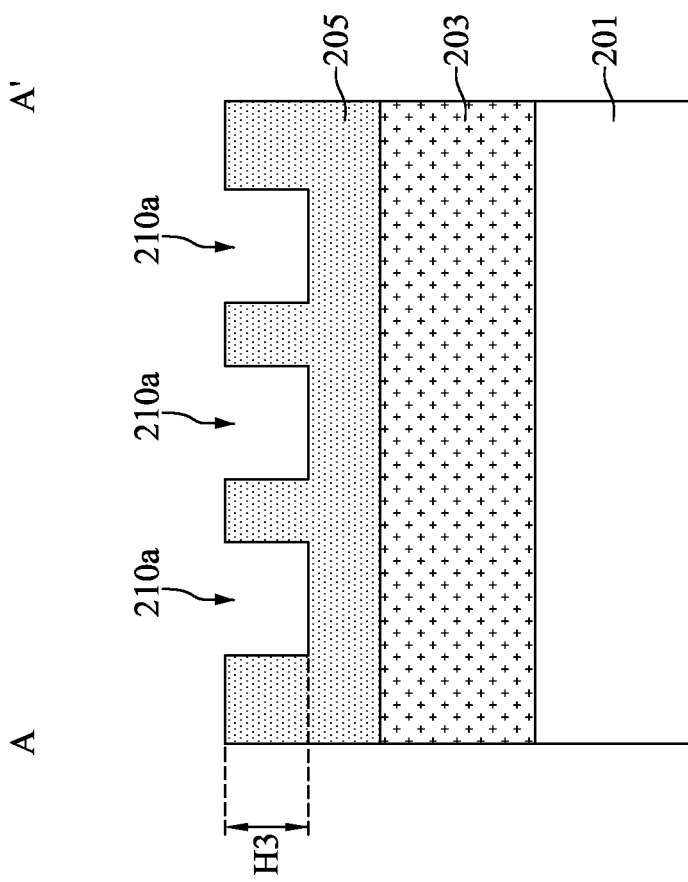
Figure 15:
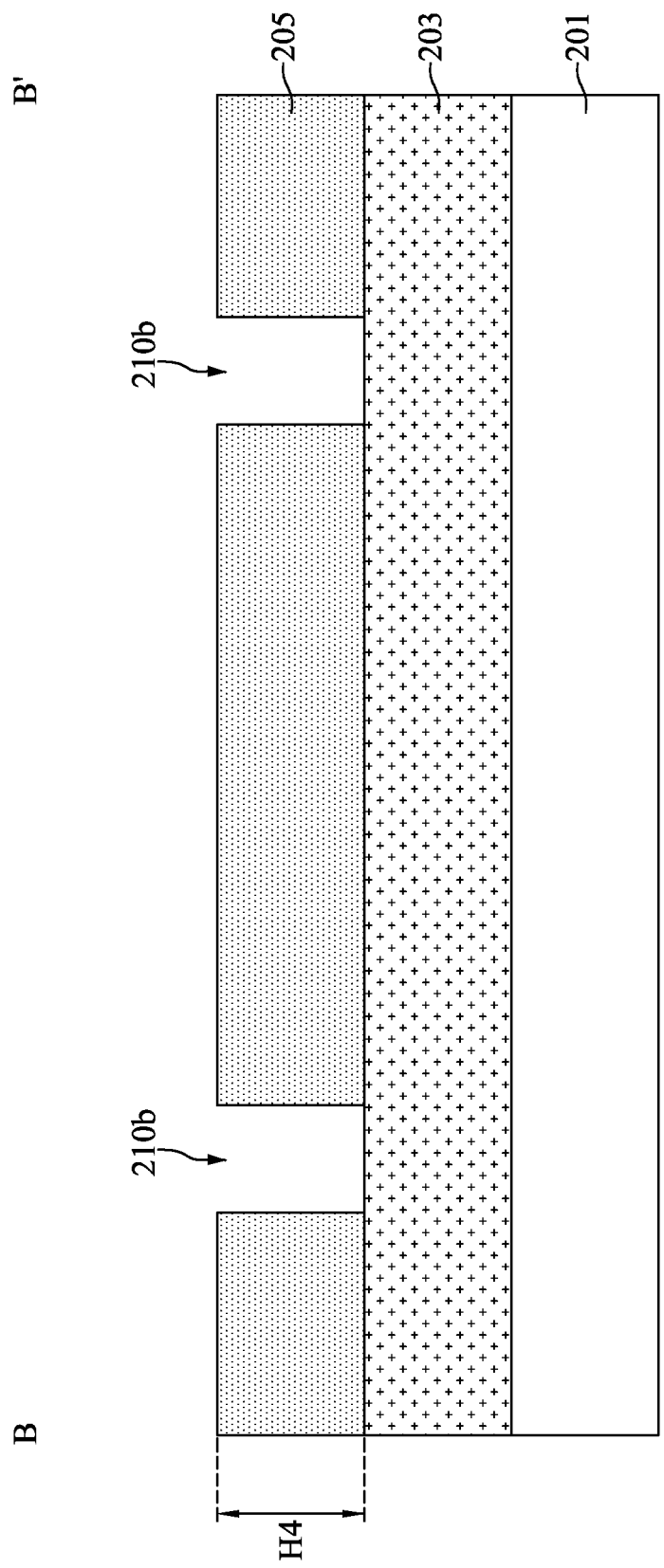
Figure 16:
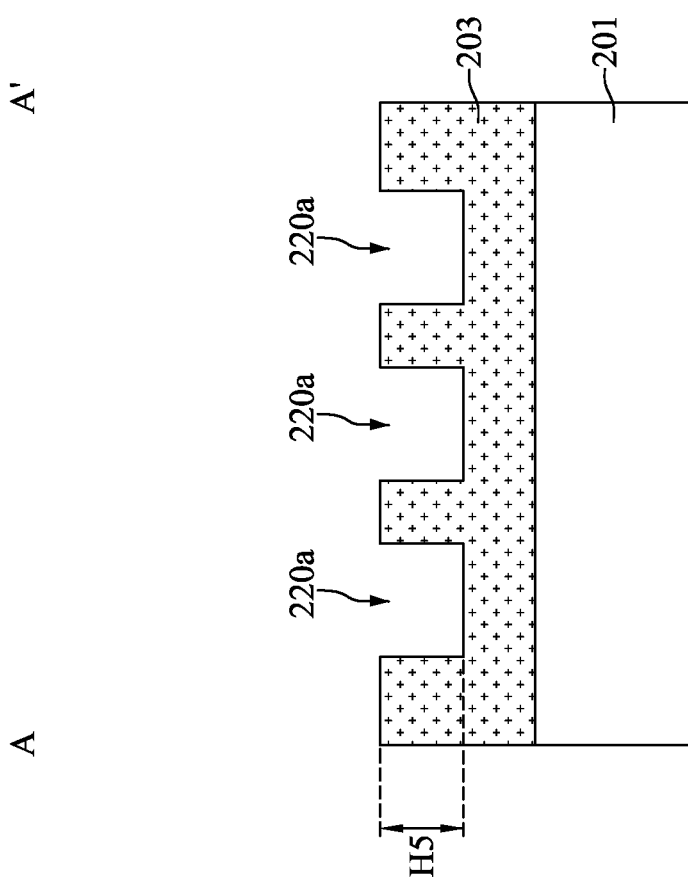
Figure 17:
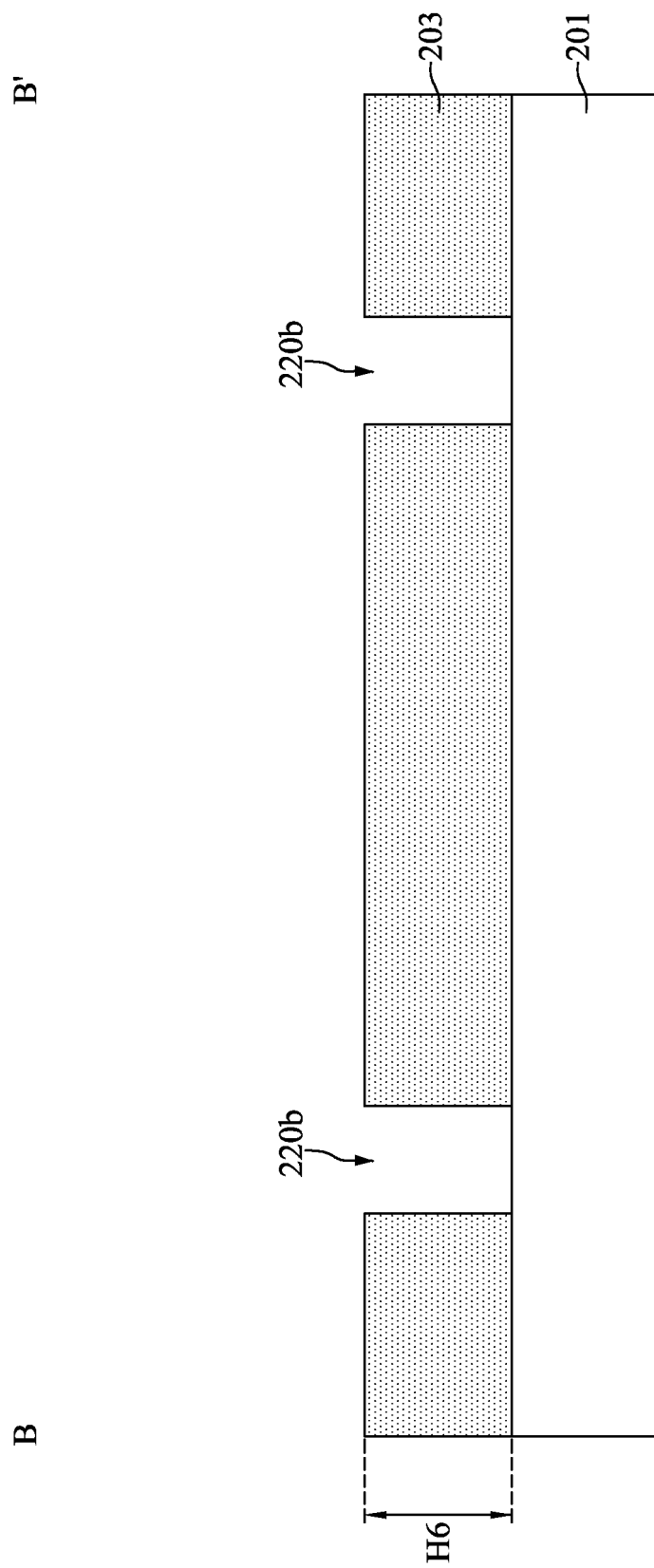
Figure 21:
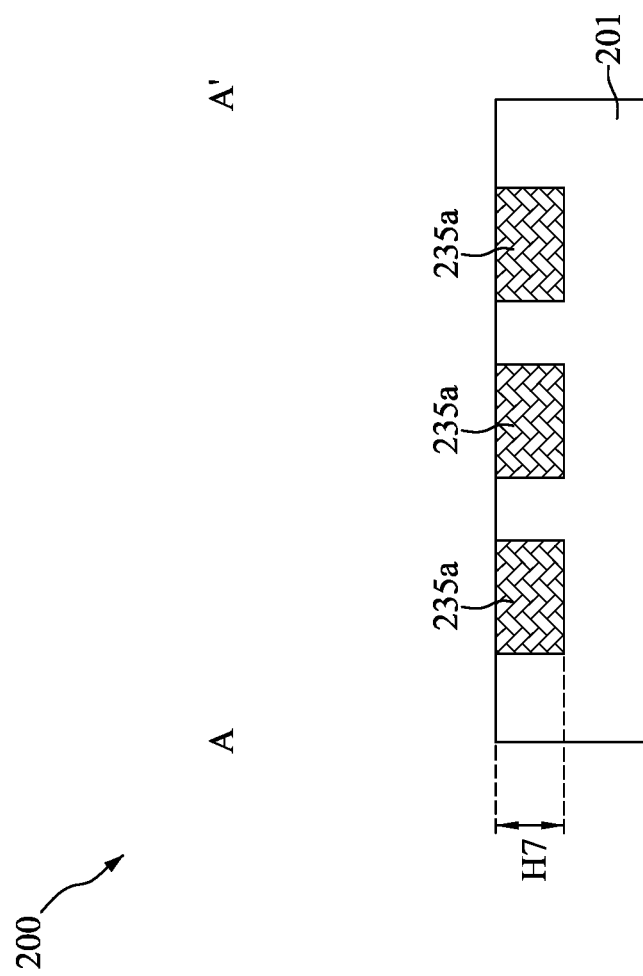
Figure 22:
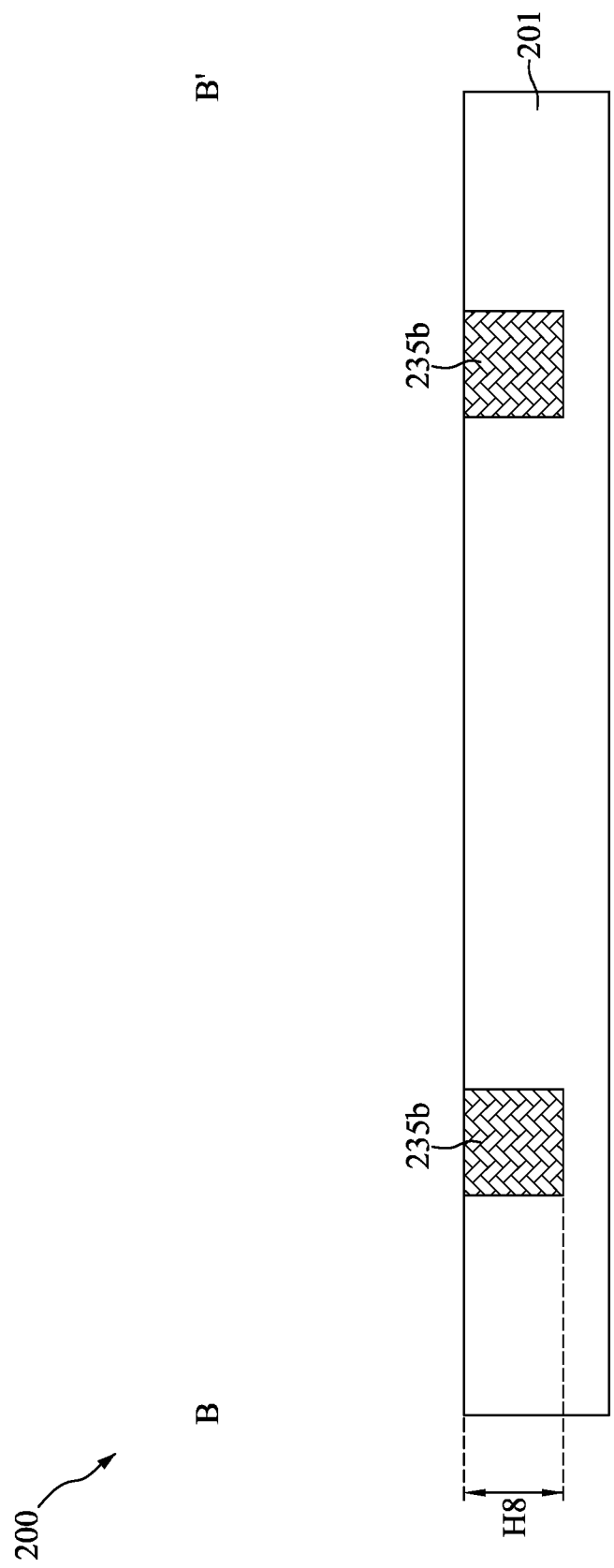

FIG. 11 is taken along line A-A' in FIG. 10. FIG. 13 is taken along line B-B' in FIG. 12. FIGS. 14, 16 and 18 are taken along the same line A-A' as FIG. 10. FIGS. 15, 17 and 19 are taken along the same line B-B' as FIG. 12. FIG. 21 is taken along line A-A' in FIG. 20, and FIG. 22 is taken along line B-B' in FIG. 20.

As shown in FIGS. 10 and 11, a target layer 203 and an energy-sensitive layer 205 are sequentially formed over a semiconductor substrate 201, in accordance with some embodiments. The respective steps are illustrated as the steps S31-S33 in the method 30 shown in FIG. 2. Some details of the semiconductor substrate 201 are similar to, or the same as that of the semiconductor substrate 101 of the semiconductor device structure 100 and are not repeated herein.

In addition, some materials and processes used to form the target layer 203 and the energy-sensitive layer 205 are similar to, or the same as those used to form the target layer 103 and the energy-sensitive layer 105 of the semiconductor device structure 100, and details thereof are not repeated herein. Still referring to FIGS. 10 and 11, after the energy-sensitive layer 205 is formed, a first energy treating process is performed to form a plurality of first treated portions 207 in the energy-sensitive layer 205, in accordance with some embodiments. The respective step is illustrated as the step S35 in the method 30 shown in FIG. 2.

In some embodiments, the first treated portions 207 extend along the same direction (e.g., the X-direction). In some embodiments, the first treated portions 207 are parallel to each other. In some embodiments, the first treated portions 207 have a height H3, and the bottom surfaces of the first treated portions 207 are higher than the bottom surface of the energy-sensitive layer 205.

In some embodiments, a patterned hard mask (not shown) is optionally formed to be utilized in the first energy treating process depending on the energy source of the first energy treating process. In some embodiments, the energy source of the first energy treating process includes visible light, UV, DUV, EUV, X-ray, e-beam, ion beam, or another suitable energy source. If a patterned hard mask is used to form the first treated portions 207, the patterned hard mask may be removed after the first treated portions 207 are formed.

Next, a second energy treating process is performed to form a plurality of second treated portions 209 in the energy-sensitive layer 205, as shown in FIGS. 12 and 13 in accordance with some embodiments. The respective step is illustrated as the step S37 in the method 30 shown in FIG. 2. Similar to the energy source of the first treating process, the energy source of the second energy treating process includes visible light, UV, DUV, EUV, X-ray, e-beam, ion beam, or another suitable energy source, in accordance with some embodiments.

In some embodiments, the first treated portions 207 are parallel to each other, and each of the second treated portions 209 is located between and in direct contact with any two adjacent ones of the first treated portions 207. Moreover, in some embodiments, the energy used in the second energy treating process is selected such that each of the second treated portions 209 penetrate through the energy-sensitive layer 205. In other words, the height of the second treated portions 209 is the same as the height of the energy-sensitive layer 205 (e.g., the height H4). However, other energy level may be utilized during the second energy treating process such that the resulting bottom surfaces of the second treated portions 209 are higher than the bottom surfaces of the energy-sensitive layer 205.

In some embodiments, the energy used in the second energy treating process is greater than the energy used in the first energy treating process, such that the height H4 of the second treated portions 209 is greater than the height H3 of the first treated portions 207 (see FIG. 11). In some embodiments, the bottom surfaces of the first treated portions 207 are higher than the bottom surface of the energy-sensitive layer 205 (i.e., the top surface of the target layer 203). In some embodiments, the bottom surfaces of the first treated portions 207 are higher than the bottom surfaces of the second treated portions 209. If a patterned hard mask is used to form the second treated portions 209, the patterned hard mask may be removed after the second treated portions 209 are formed.

Subsequently, the first treated portions 207 and the second treated portions 209 are removed to respectively form openings 210a and 210b in the energy-sensitive layer 205, as shown in FIGS. 13 and 14 in accordance with some embodiments. The respective step is illustrated as the step S39 in the method 30 shown in FIG. 2. In some embodiments, the bottom surfaces of the openings 210a are higher than the bottom surfaces of the openings 210b.

In some embodiments, the openings 210a have a height substantially the same as the height H3 of the first treated portions 207, and the openings 210b have a height substantially the same as the height H4. In some embodiments, the first treated portions 207 and the second treated portions 209 are removed by an etching process. The etching process may include a wet etching process, a dry etching process, or a combination thereof.

Then, the openings 210a and 210b in the energy-sensitive layer 205 are transferred into the target layer 203 to respectively form openings 220a and 220b in the target layer 203, as shown in FIGS. 16 and 17 in accordance with some embodiments. The respective step is illustrated as the step S41 in the method 30 shown in FIG. 2. In some embodiments, the openings 220a and 220b are transferred into the target layer 203 by an etching process, such as a dry etching process.

In some embodiments, the bottom surfaces of the openings 220a are higher than the bottom surfaces of the openings 220b. In some embodiments, the openings 220a have a height H5, the openings 220b have a height H6, and the height H6 is greater than the height H5. After the openings 220a and 220b are formed, the energy-sensitive layer 205 may be removed.

Next, the openings 220a and 220b in the target layer 203 are transferred into the semiconductor substrate 201 to respectively form openings 230a and 230b in the semiconductor substrate 201, as shown in FIGS. 18 and 19 in accordance with some embodiments. The respective step is illustrated as the step S43 in the method 30 shown in FIG. 2. In some embodiments, the openings 230a and 230b are transferred into the semiconductor substrate 201 by an etching process, such as a dry etching process.

In some embodiments, the bottom surfaces of the openings 230a are higher than the bottom surfaces of the openings 230b. In some embodiments, the openings 230a have a height H7, the openings 230b have a height H8, and the height H8 is greater than the height H7. After the openings 230a and 230b are formed, the target layer 203 may be removed.

Subsequently, an isolation structure 235 is filled into the openings 230a and 230b in the semiconductor substrate 201, as shown in FIGS. 20-22 in accordance with some embodiments. The respective step is illustrated as the step S45 in the method 30 shown in FIG. 2. In some embodiments, the isolation structure 235 has first portions 235a filled into the openings 230a and second portions 235b filled into the openings 230b.

In some embodiments, the isolation structure 235 has different heights (i.e., depths) in different cross-sections. For example, the isolation structure 235 has the height H7 in the cross-section taken along line A-A' in the top view (FIG. 20), and the isolation structure 235 has the height H8 in the cross-section taken along line B-B' in the top view. In some embodiments, the height H8 is greater than the height H7.

In some embodiments, the isolation structure 235a includes a dielectric material, such as silicon oxide, silicon nitride, silicon oxynitride, a low-k dielectric material or another suitable material. The isolation structure 235a may be formed by a procedure including deposition and planarization. The deposition process may include a CVD process, a PVD process, an ALD process, a spin-on coating process, or another suitable method. The planarization process may include a chemical mechanical planarization (CMP) process.

In some embodiments, the planarization process is performed until the top surface of the semiconductor substrate 201 is exposed. After the isolation structure 235 is formed, the semiconductor device structure 200 is obtained. In some embodiments, a plurality of island-shaped active areas (AA) are surrounded by the isolation structure 235.

Embodiments of the method for preparing a semiconductor device structure with patterns having different heights are provided in the disclosure. The method includes sequentially forming a target layer (e.g., the target layers 103 and 203) and an energy-sensitive layer (e.g., the energy-sensitive layers 105 and 205) over a semiconductor substrate (e.g., the semiconductor substrates 101 and 201), and forming first treated portion(s) (e.g., the first treated portions 113 and 207) and second treated portion(s) (e.g., the second treated portions 123 and 209) in the energy-sensitive layer. The method also includes removing the first treated portion(s) and the second treated portion(s) to form first opening(s) (e.g., the openings 130a and 210a) and second opening(s) (e.g., the openings 130b and 210b), and transferring the first and the second openings into the target layer, or even the semiconductor substrate.

In some embodiments, the first treated portion(s) and the second treated portion(s) have different heights. Therefore, the openings with different heights (i.e., depths) can be transferred into the target layer or the semiconductor substrate using the same pattern transferring process. As a result, the fabrication cost and time of the semiconductor device structure (e.g., the semiconductor device structures 100 and 200) can be reduced, and greater design flexibility can be achieved.

In one embodiment of the present disclosure, a method for preparing a semiconductor device structure is provided. The method includes forming a target layer over a semiconductor substrate, and forming an energy-sensitive layer over the target layer. The method also includes performing a first energy treating process to form a first treated portion in the energy-sensitive layer, and performing a second energy treating process to form a second treated portion in the energy-sensitive layer. The method further includes removing the first treated portion and the second treated portion to form a first opening and a second opening in the energy-sensitive layer, and transferring the first opening and the second opening into the target layer.

In another embodiment of the present disclosure, a method for preparing a semiconductor device structure is provided. The method includes forming a target layer over a semiconductor substrate, and forming an energy-sensitive layer over the target layer. The method also includes performing a first energy treating process to form a plurality of first treated portions in the energy-sensitive layer, and performing a second energy treating process to form a plurality of second treated portions in the energy-sensitive layer. The method further includes removing the first treated portions and the second treated portions to respectively form a plurality of first openings and a plurality of second openings, and transferring the first openings and the second openings into the target layer to respectively form a plurality of third openings and a plurality of fourth openings. In addition, the method includes transferring the third openings and the fourth openings into the semiconductor substrate to respectively form a plurality of fifth openings and a plurality of sixth openings, and filling the fifth openings and the sixth openings with an isolation structure.

The embodiments of the present disclosure have some advantageous features. By forming treated portions with different heights in the energy-sensitive layer, the openings with different heights (or depths) can be transferred into the target layer using the same pattern transferring process. As a result, the fabrication cost and time can be reduced, and greater design flexibility can be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a target layer over a semiconductor substrate;
    forming an energy-sensitive layer over the target layer;
    performing a first energy treating process to form a plurality of first treated portions in the energy-sensitive layer;
    performing a second energy treating process to form a plurality of second treated portions in the energy-sensitive layer;
    removing the first treated portions and the second treated portions to respectively form a plurality of first openings and a plurality of second openings;
    transferring the first openings and the second openings into the target layer to respectively form a plurality of third openings and a plurality of fourth openings;
    transferring the third openings and the fourth openings into the semiconductor substrate to respectively form a plurality of fifth openings and a plurality of sixth openings; and
    filling the fifth openings and the sixth openings with an isolation structure;
    wherein the first treated portions extend along a first direction, and the second treated portions extend along a second direction different from the first direction;
    wherein the first treated portions are parallel to each other, and wherein each of the second treated portions is located between and in direct contact with any two adjacent ones of the first treated portions.

2. The method for preparing a semiconductor device structure of claim 1, wherein the isolation structure has different heights in different cross-sections.

3. The method for preparing a semiconductor device structure of claim 1, wherein the first energy treating process and the second energy treating process are electron-beam (e-beam) writing processes.

4. The method for preparing a semiconductor device structure of claim 1, wherein the first treated portions are formed by applying a first energy to the energy-sensitive layer, and the second treated portions are formed by applying a second energy to the energy-sensitive layer, and wherein the second energy is greater than the first energy.

5. The method for preparing a semiconductor device structure of claim 4, wherein the first treated portions have a first height, and the second treated portions have a second height, and wherein the second height is greater than the first height.

6. The method for preparing a semiconductor device structure of claim 1, further comprising:
    removing the energy-sensitive layer after the third openings and the fourth openings are formed in the target layer.

7. The method for preparing a semiconductor device structure of claim 6, further comprising:
    removing the target layer after the fifth openings and the sixth openings are formed in the semiconductor substrate.

8. The method for preparing a semiconductor device structure of claim 7, wherein the target layer is removed before the isolation structure is formed.

9. The method for preparing a semiconductor device structure of claim 1, wherein the energy-sensitive layer includes a cross-linking compound having a cross-linking functional group.

10. The method for preparing a semiconductor device structure of claim 9, wherein the cross-linking functional group includes a double bond.

11. The method for preparing a semiconductor device structure of claim 1, wherein bottom surfaces of the first treated portions are higher than bottom surfaces of the second treated portions.

12. The method for preparing a semiconductor device structure of claim 1, wherein bottom surfaces of the first openings in the energy-sensitive layer are higher than bottom surfaces of the second openings in the energy-sensitive layer.

13. The method for preparing a semiconductor device structure of claim 1, wherein bottom surfaces of the third openings in the target layer are higher than bottom surfaces of the fourth openings in the target layer.

14. The method for preparing a semiconductor device structure of claim 1, wherein bottom surfaces of the fifth openings in the semiconductor substrate are higher than bottom surfaces of the sixth openings in the semiconductor substrate.

* * * * *